(12) United States Patent
Seibert

(10) Patent No.: US 12,720,698 B2
(45) Date of Patent: Aug. 25, 2026

(54) HOUSING FOR SECURING IGNITION SOURCES

(71) Applicant: Samcon Prozessleittechnik GmbH, Lohra-Altenvers (DE)

(72) Inventor: Steffen Seibert, Altenvers/ Lohra (DE)

(73) Assignee: SAMCON PROZESSLEITTECHNIK GMBH, Lohra-Altenvers (DE)

( * ) Notice: Subject to any disclaimer, the term of this patent is extended or adjusted under 35 U.S.C. 154(b) by 323 days.

(21) Appl. No.: 18/638,898

(22) Filed: Apr. 18, 2024

(65) Prior Publication Data

US 2024/0357760 A1 Oct. 24, 2024

(30) Foreign Application Priority Data

Apr. 24, 2023 (EP) .................................... 23169543

(51) Int. Cl.
*H05K 5/06* (2006.01)
*H05K 5/02* (2006.01)
*H05K 5/04* (2006.01)

(52) U.S. Cl.
CPC ........... *H05K 5/069* (2013.01); *H05K 5/0217* (2013.01); *H05K 5/04* (2013.01)

(58) Field of Classification Search
CPC ........ H05K 5/069; H05K 5/0217; H05K 5/04; H05K 5/0247
See application file for complete search history.

(56) References Cited

U.S. PATENT DOCUMENTS

2018/0076617 A1* 3/2018 Boese ...................... H01T 1/14
2018/0366916 A1* 12/2018 Mugwyler ................ H01T 1/16

FOREIGN PATENT DOCUMENTS

DE 20 2015 105105 10/2015
DE 10 2019 104616 8/2020
EP 2 881 959 10/2016
EP 3 314 701 8/2019
WO 03/090320 10/2003

* cited by examiner

*Primary Examiner* — Sherman Ng
(74) *Attorney, Agent, or Firm* — Millen, White, Zelano & Branigan, P.C.; Christopher W. Brody

(57) ABSTRACT

The invention being presented relates to a housing (100) for securing ignition sources, wherein the housing (100) is explosion-proof against an explosion occurring in the housing (100) and wherein the housing (100) comprises:

Figure 1:
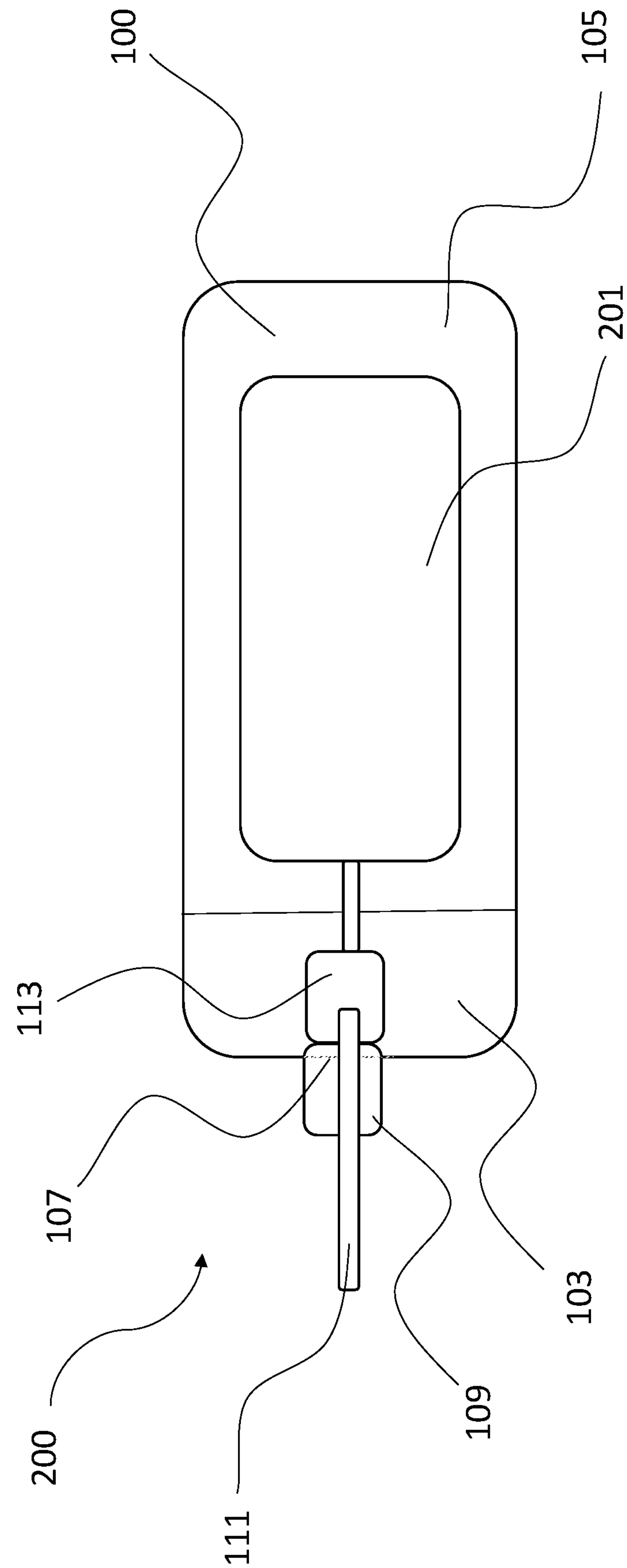

a housing body (101), an opening (107) introduced into the housing body (101) for connection to a cable entry (109, 303), an interface (113, 301) arranged on the housing body (101) for connection to a cable (127) running through the opening (107), wherein the interface (113, 301) is movable between a coupling position and a rest position, wherein the interface (113, 301) is further away from one end of the housing body (100) opposite the opening (107) in the coupling position along a vertical axis of the housing body (101) than in the rest position.

16 Claims, 4 Drawing Sheets

HOUSING FOR SECURING IGNITION SOURCES

The invention being presented relates to a housing for securing ignition sources, a connecting method for connecting an ignition source secured in a housing to a cable, an electronic system and a housing element in accordance with the attached claims.

Various protection types for securing ignition sources against a propagation of ignited fluids, in particular gases, into the surroundings are known in the art. These are described in corresponding standards such as "Pressure-tight encapsulation", Ex "d" or "Increased safety", Ex "e", which relate to the containment of an explosion that may occur within a housing. This is achieved through an explosion-proof design of a housing, along with spark-resistant gaps on all housing openings.

Furthermore, a surface temperature of operating equipment must be limited below the ignition temperature of the surrounding explosive atmosphere, even in the event of a fault that was to be expected. The requirements made of operating equipment are described in standard IEC/EN/DIN 60079-0/-1.

In particular, the ignition protection type Ex "d" must also be used if ignition sources occur inside the operating equipment during undisturbed operation.

With explosion-proof housings, there is a challenge in relation to the wiring of electrical components, in particular for supplying the components with electrical power. According to the state of the art, a separate connection space is provided for this purpose in the housing which is separated from a receiving space for accommodating an ignition source. Accordingly, the connection space is opened, a wiring interface such as a terminal, for example, is introduced into the connection space and the connection space is closed again. For this purpose, the connection space must be constructed and implemented with a mechanism for opening and closing consistent with the ignition protection type.

Particularly in the case of pressure-tight encapsulation, a construction of this kind which is suitable for the ignition protection type is highly complex and consists of at least two mechanisms: firstly, a cover to open the connection space according to the ignition protection type and close it again and secondly, openings for cable leads to introduce cables into the connection space accordingly. Both require space and constructive effort.

Since the wiring in the connection space constitutes an ignition source, the same safety requirements apply to the connection space as to the receiving space. Therefore, housings of this kind are voluminous and complex in construction.

Against this background, an object of the invention being presented is that of providing a possible way of easily and safely wiring an electronic component arranged in an explosion-proof housing.

To achieve the aforementioned object, according to a first aspect of the invention being presented, a housing is presented for securing ignition sources.

The housing being presented is explosion-proof against an explosion occurring in the housing and comprises a housing body, an opening introduced into the housing body for connection to a cable entry and an interface arranged on the housing body for connection to a cable running through the opening, wherein the interface is movable between a coupling position and a rest position and wherein the interface is further away from one end of the housing body opposite the opening in the coupling position along a vertical axis of the housing body than in the rest position.

The invention being presented is based on an interface for coupling with a cable. Accordingly, the interface is configured to be electrically and mechanically connected to a cable.

Optionally, the interface may be configured to be connected to a second cable arranged in the housing or may directly comprise a cable running in the housing. In any case, the interface provides a possible way of transmitting electrical impulses or signals, in particular electric current, into a receiving space formed in the housing.

The interface provided according to the invention may, for example, comprise a connector, in particular a plug connection or a port for a cable, such as an Ethernet cable, a power cable, a coaxial cable or any other technically suitable cable for transmitting electrical impulses or signals to an electronic component, for example.

The interface provided according to the invention is arranged on the housing being presented in such a manner that a cable running through an opening made in the housing body of the housing, in particular in a cover or a housing element of the housing, is guided to the interface and coupled thereto. Accordingly, the cable can be coupled to an electronic component arranged in the housing via the interface, without opening the housing. Furthermore, separate or additional connection space for wiring can be dispensed with, so that the housing can be constructed in a particularly compact and simple manner.

For example, the housing body of the housing being presented may have a one-piece or monolithic configuration. A one-piece or monolithic housing is particularly pressure-resistant. Alternatively, the housing being presented may have a multipart configuration and, for example, comprise a housing element with the interface and a receiving space arranged on the housing element.

To enable a cable guided through the opening provided according to the invention to be coupled with the interface provided according to the invention without opening the housing, the interface is movable between a coupling position and a rest position.

In the coupling position, the interface is further away from one end of the housing body opposite the opening along a vertical axis of the housing body than in the rest position. This means that the interface is accessible from outside or from outside the housing in the coupling position, so that it can be contacted and coupled with a cable. The interface may, optionally, protrude from the housing or a housing bore forming the opening, i.e. protrude beyond the housing body, or protrude into an edge area of the housing, so that the interface, together with the housing or the housing bore, forms a guided path for the cable, and a cable introduced into the opening is forced to move into the interface or couple with it.

In the rest position, the interface is closer to one end of the housing body opposite the opening along a vertical axis of the housing body than in the coupling position. Accordingly, in the rest position, the interface is immersed deeper into the housing than in the coupling position, so that, for example, a space is opened up above the interface into which a protective cap can be introduced.

In the rest position, a mating interface of the cable is introduced into the housing, so that the mating interface of the cable is located together with the interface of the housing in the housing and is secured accordingly. For this purpose, an interface receptacle may be formed in the housing, with which the interface and the mating interface engage in the rest position. Accordingly, the wiring is displaced deep into the housing and thereby protects an area surrounding the housing from the wiring.

It may be provided that the housing complies with the ignition protection type "Pressure-tight encapsulation", Ex "d", in particular standard IEC/EN/DIN 60079-1.

A housing that complies with the ignition protection type "Pressure-tight encapsulation", Ex "d", in particular standard IEC/EN/DIN 60079-1, secures an environment against an explosion taking place inside the housing, preventing the explosion from spreading to the surrounding area and, in particular, protecting any fluids present in the surrounding area. To achieve this, the housing may, for example, be made of metal and sealed in a fluid-tight and ignition-proof manner.

Furthermore, it may be provided that the housing comprises a cable entry, wherein the cable entry complies with the ignition protection type "Pressure-tight encapsulation", Ex "d", in particular standard IEC/EN/DIN 60079-1 or the cable entry complies with the ignition protection type "Increased safety", Ex "e", in particular standard IEC/EN/DIN 60079-7.

With a cable entry that complies with the ignition protection type "Pressure-tight encapsulation", Ex "d", in particular standard IEC/EN/DIN 60079-1, a pressure-tight encapsulation of a cable interface in the interface of the housing is achieved. For this purpose, the cable entry may, for example, be made of metal and connected to the housing in a fluid-tight and ignition-proof manner. Consequently, through the configuration of the housing and the cable entry, the interface can be configured independently of any predefined ignition protection type, since it is secured by the cable entry.

In the case of a cable entry that complies with the ignition protection type "Increased safety", Ex "e", in particular standard IEC/EN/DIN 60079-7, the interface of the housing is configured in such a manner as to comply with the ignition protection type "Pressure-tight encapsulation", Ex "d", in particular standard IEC/EN/DIN 60079-1. For this purpose, the interface may, for example, be made of metal and/or include a casing that is connected to the housing in a fluid-tight manner and comprise a movable part that is arranged in the casing in a movable and, in particular fluid-tight or ignition-proof manner. Accordingly, the cable entry can thereby be designed independently of the ignition protection type, for example, from a plastic, since it is secured by the interface.

It may be further provided that the housing comprises only one space and, on account of this, is configured without a separate connection space.

A single space or a single receptacle for an electronic component allows a particularly compact and simple connection space-free construction of the housing being presented.

It may furthermore be provided that the housing body comprises a detachable cap, wherein the opening is made in the cap.

A detachable cap allows the insertion of an electronic component into the housing.

It may also be provided that the interface comprises at least one elastic element, in particular a mechanical spring, wherein the at least one elastic element presses the interface from the rest position towards the coupling position.

An elastic element such as a mechanical spring, for example, allows movement of the interface from the rest position into the coupling position, without the need for the housing to be opened.

It may be furthermore provided that the interface includes a push-push mechanism.

To supply a push-push mechanism, another elastic element may be provided that pushes the interface from the coupling position into the rest position. This allows a cable to be securely coupled to the interface of the housing and then moved or pushed into the rest position by the additional elastic element.

It may also be provided that the interface in the housing is surrounded by a capsule, wherein the capsule comprises a cable entry.

A capsule with a cable entry provides a casing for the interface, so that the capsule meets the requirements of a respective protection type and the interface, as well as a respective cable, can be designed independently of the protection type.

It may be further provided that the interface forms an ignition-proof cylindrical gap and/or thread gap and/or flat gap.

An ignition-proof cylindrical gap and/or thread gap and/or flat gap formed by the interface or between the interface and the housing allows the use of an embodiment of a respective cable entry that is independent of the protection type of the housing, in particular a cable entry of the protection type "Increased safety", Ex "e".

It may be further provided that the housing comprises a securing element that secures the interface in the rest position, wherein the interface is at least partially movable about its longitudinal axis between a secured position and a released position, wherein the interface is secured in the secured position by the securing element to prevent movement from the rest position into the coupling position, and wherein the interface is freely movable between the rest position and the coupling position in the released position.

A securing element that engages with the interface through a longitudinal rotation thereof allows for a simple, reversible securing of the interface in the rest position.

According to a second aspect, the invention being presented relates to a connection method for connecting an ignition source secured in a housing to a cable.

The connection method being presented includes providing a possible configuration of the housing being presented, moving the interface from the rest position into the coupling position, connecting the cable to the interface and moving the interface from the coupling position into the rest position.

The housing being presented is used, in particular, to carry out the connection method being presented.

It may be provided that the cable is guided through a cable entry and the cable entry is connected to the housing.

By means of a cable entry, a respective cable can be guided and securely arranged on the housing. In this case, the cable entry can possibly be designed according to a respective protection type, so that an interface of the cable is secured in respect of the surrounding area by the cable entry.

It may also be provided that, when moving the interface from the coupling position to the rest position, the cable is rotated about its longitudinal axis together with at least a part of the interface, so that the interface is moved into a secured position in which the interface is secured to prevent movement from the rest position into the coupling position.

A rotational movement for securing or releasing a respective cable in the rest position can be carried out simply and quickly. In particular, a rotational movement for securing or releasing a respective cable in the rest position means that an opening of the housing to couple the cable to the interface of the housing is avoided.

According to a third aspect, the invention being presented relates to an electronic system. The electronic system comprises an electronic component such as a camera and/or a luminaire, for example, and a possible embodiment of the housing being presented, wherein the electronic component is arranged in the housing and connected to a cable via the interface of the housing.

On account of the housing being presented, all ignition sources of the electronic system being presented are secured within the housing, in particular secured in an explosion-proof manner.

In accordance with a fourth aspect, the invention being presented relates to a housing element for a housing for securing ignition sources, wherein the housing is explosion-proof in respect of an explosion occurring inside the housing.

The housing element comprises a housing element body, an opening introduced into the housing element body for connection to a cable entry and an interface arranged on the housing element body for connection to a cable running through the opening, wherein the interface is movable between a coupling position and a rest position and wherein the interface is further away from one end of the housing element body opposite the opening in the coupling position along a vertical axis of the housing element body than in the rest position.

The housing element being presented is particularly used for connection to a base body in order to form an explosion-proof housing. For this purpose, the housing element may, for example, form a cap or a receiving chamber of a housing. For this purpose, the housing element may be configured, for example, to form an ignition-proof barrier together with the housing.

Figure 2:
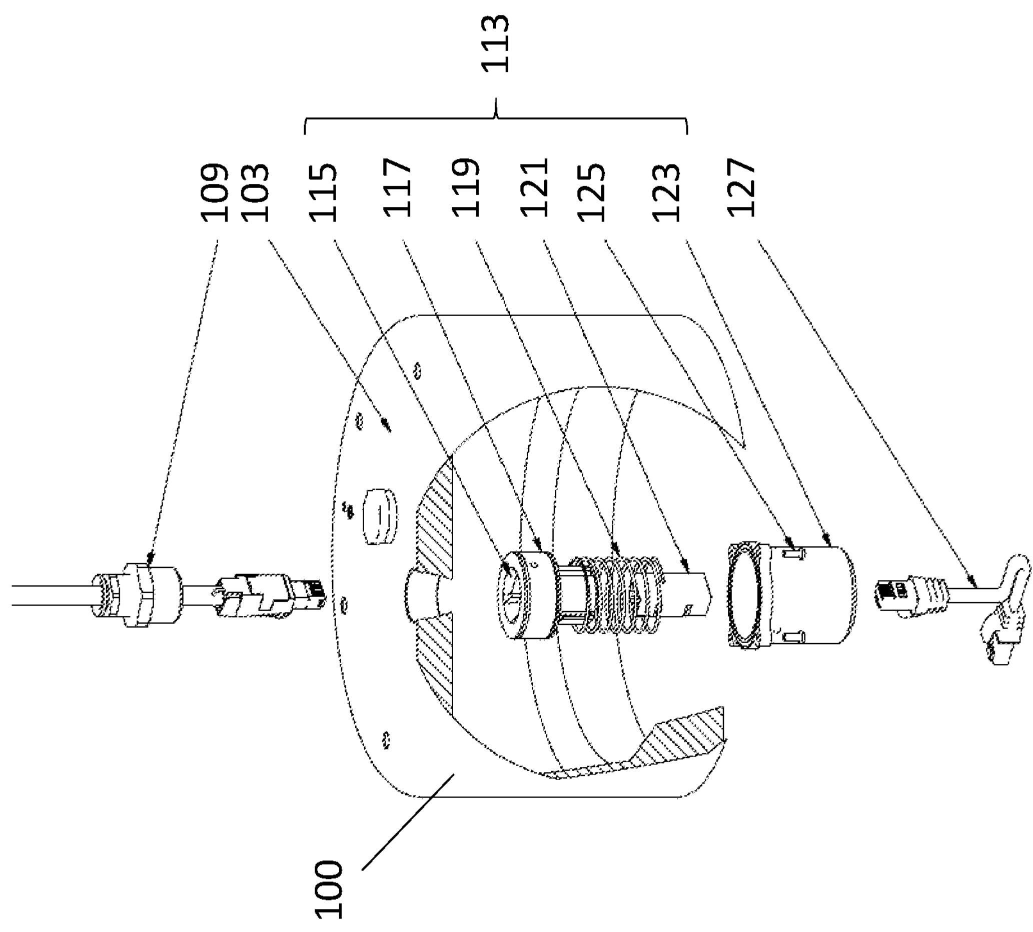
Figure 3:
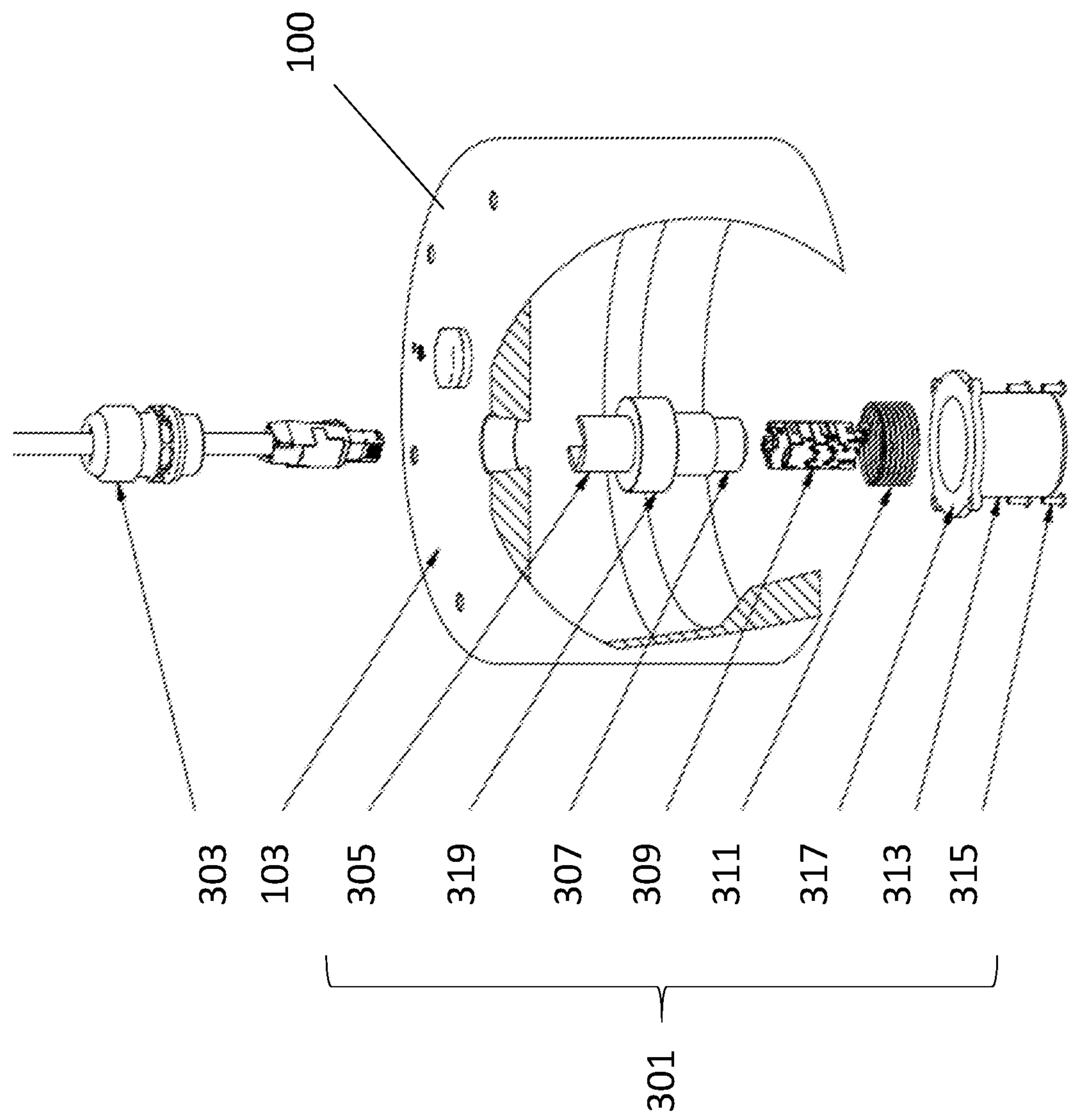
Figure 4:
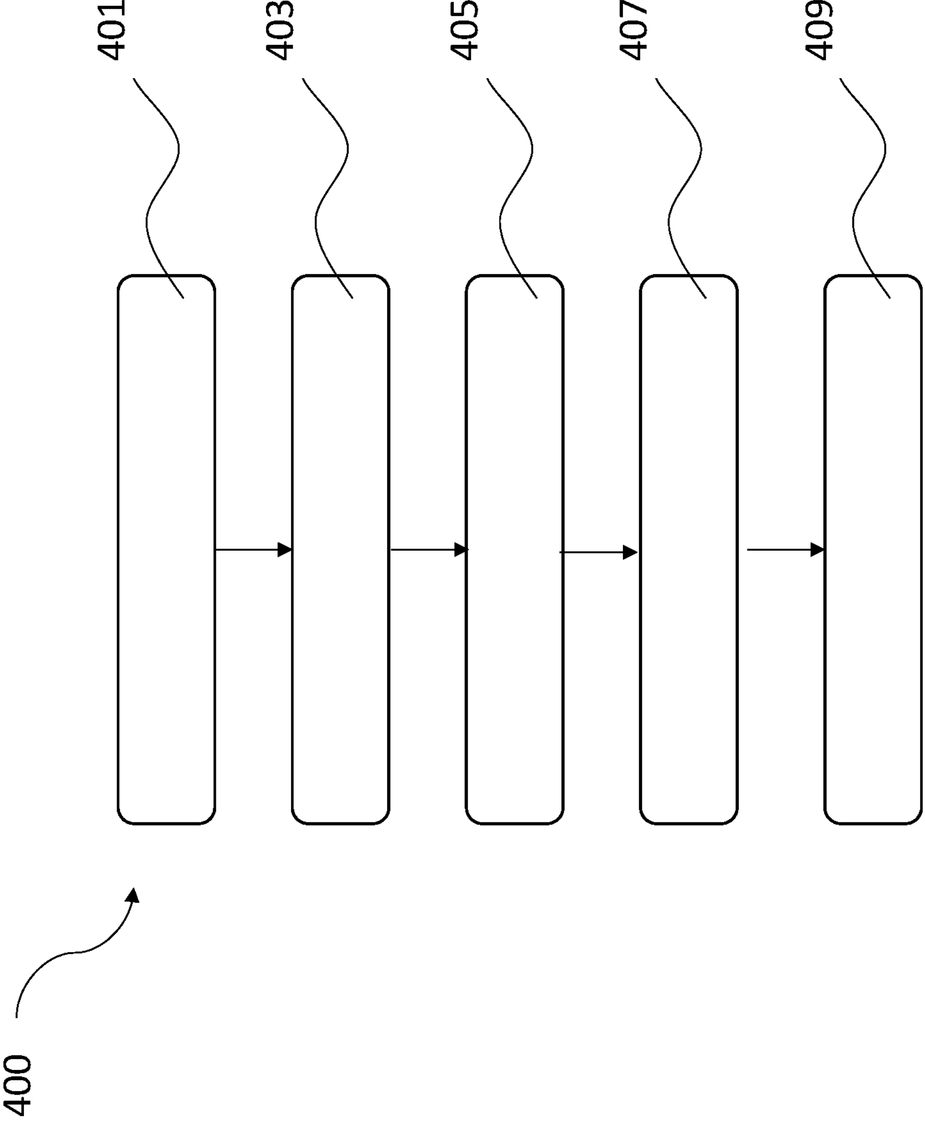

Further features, details and advantages of the invention will emerge from the wording of the claims and from the following description of exemplary embodiments with reference to the drawings. In the drawings:

FIG. 1: shows a possible configuration of the electronic system being presented with a possible configuration of the housing being presented and a possible configuration of the housing element being presented, FIG. 2: shows a detailed depiction of a possible configuration of the housing being presented, FIG. 3: shows a detailed depiction of another possible configuration of the housing being presented, FIG. 4: shows a depiction of a possible configuration of the connection method being presented.

An electronic system 200 is shown in FIG. 1. The electronic system 200 comprises a housing 100 for securing ignition sources and an electronic component 201 in the form of a camera. The housing 100 is explosion-proof in respect of an explosion occurring inside the housing 100 and comprises a housing body 101 which includes a housing element 103 in the form of a cap and a receiving chamber 105.

In the housing element 103, an opening 107 is formed for connection to a cable entry 109 and for routing a cable 111. Furthermore, the housing element 103 comprises an interface 113 for connection to the cable 111.

The interface 113 is movable between a coupling position and a rest position, as shown in detail in FIG. 4. Accordingly, the cable 111 can be easily and quickly connected to the interface 113 in the coupling position without opening the housing 100 and it is secured in the housing 100 in an explosion-proof manner in the rest position.

The electronic component 201 is coupled to the interface 113 via another cable 127, so that the electronic component 201 can be supplied with electrical signals, in particular electrical power, via the cable 111 and the cable 127.

The housing 100 is shown in detail in FIG. 2. In this case, the interface 113 is shown in an exploded view with its components. The housing element 103 in this case is made of metal, as is an optional cable entry 109 of protection type "Ex-d".

The interface 113 consists of a casing element 115, a seal 117, a mechanical spring 119, a port 121 and a capsule 123. The capsule 123 is secured to the casing element 115 by screws 125.

The capsule 123 includes an opening for guiding the cable 127 running in the housing 100 to connect to the electronic component 201.

The housing 100 is shown in FIG. 3 with an alternative interface 301. The housing element 103 in this case is of protection type "Ex-d", whereas the optional cable entry 303 is of protection type "Ex-e" and may be made of plastic, for example.

The interface 301 consists of a metallic casing element 305, a potting compound 307, an Ethernet crimp connector 309, a mechanical spring 311 and a metallic capsule 313, which is secured to the casing element 305 by screws 315 and forms an explosion-proof gap 317, in particular a flat gap, in respect of the casing element 305.

The casing element 305 also forms an explosion-proof gap 319 in respect of the housing element 103.

A connection method 400 is depicted in FIG. 4. The connection method 400 comprises a provision step 401, in which a possible configuration of the housing being presented, such as the housing 100 according to FIG. 1, for example, is provided.

In a movement step 403, the interface 113 of the housing 100, when this is in its rest position, is moved into its coupling position, in that it is briefly pressed to activate a push-push mechanism, for example.

When the interface 113 is moved to its coupling position, a cable 111 is connected to the interface 113 in a connection step 405.

In a movement step 407, the cable 111 is initially rotated about its longitudinal axis, for example, by 90°, and then moved, in particular pressed, into its rest position.

In a securing step 409, a cable entry 109 is screwed onto the housing 100, which secures the housing 100, including the interface 113, in an explosion-proof manner.

The invention is not limited to any of the embodiments described above but can be modified in various ways.

All features and advantages arising from the claims, the description, and the drawing, including structural details, spatial arrangements and method steps, may be essential to the invention, both individually and in a wide variety of combinations.

LIST OF REFERENCE SIGNS

100 Housing
101 Housing body
103 Housing element
105 Receiving chamber
107 Opening
109 Cable entry
111 Cable
113 Interface

115 Casing element
117 Seal
119 Spring
121 Port
123 Capsule
125 Screw
127 Cable
200 Electronic system
20 Electronic component
301 Interface
303 Cable entry
305 Casing element
307 Potting compound
309 Ethernet crimp connector
31 Spring
313 Capsule
315 Screw
317 Explosion-proof gap
319 Explosion-proof gap
400 Connection method
401 Provision step
403 Movement step
405 Connection step
407 Movement step
409 Securing step

The invention claimed is:

1. A housing (100) for securing ignition sources, wherein the housing (100) is explosion-proof against an explosion occurring in the housing (100) and wherein the housing (100) comprises:

a housing body (101), an opening (107) introduced into the housing body (101) for connection to a cable entry (109, 303), an interface (113, 301) arranged on the housing body (101) for connection to a cable (127) running through the opening (107), wherein the interface (113, 301) is movable between a coupling position and a rest position, wherein the interface (113, 301) is further away from one end of the housing body (100) opposite the opening (107) in the coupling position along a vertical axis of the housing body (101) than in the rest position, wherein the interface (113,301) comprises at least one elastic element that presses the interface (113,301) from the rest position to the coupling position.

2. The housing (100) according to claim 1, characterized in that the housing (100) complies with the ignition protection type "Pressure-tight encapsulation", Ex "d", in particular standard EN 60079-1.

3. The housing (100) according to claim 1, characterized in that the housing (100) comprises a cable entry (109, 303), wherein the cable entry (109) complies with the ignition protection type "Pressure-tight encapsulation", Ex "d", in particular standard EN 60079-1 or the cable entry (303) complies with the ignition protection type "Increased safety", Ex "e", in particular standard EN 60079-7.

4. The housing (100) according to claim 1, characterized in that the housing (100) only comprises a single space and, on account of this, there is no separate connection space.

5. The housing (100) according to claim 1, characterized in that the housing body (101) comprises a detachable cap (103), wherein the opening (107) is made in the cap (103).

6. The housing (100) according to claim 1, characterized in that the interface (113, 301) includes a push-push mechanism.

7. The housing (100) according to claim 1, characterized in that the interface (113, 301) in the housing (100) is surrounded by a capsule (123), wherein the capsule comprises a cable entry.

8. The housing (100) according to claim 1, characterized in that the interface (113, 301) forms an ignition-proof cylindrical gap and/or thread gap and/or flat gap.

9. The housing (100) according to claim 1, characterized in that the housing (100) comprises a securing element that secures the interface (113, 301) in the rest position, wherein the interface (113, 301) is at least partially movable about its longitudinal axis between a secured position and a released position, wherein the interface (113, 301) is secured in the secured position by the securing element to prevent movement from the rest position into the coupling position, and wherein the interface (113, 301) is freely movable between the rest position and the coupling position in the released position.

10. A connection method (400) for connecting an ignition source secured in a housing (100) to a cable, wherein the connection method (400) involves:

providing (401) a housing (100) according to claim 1, moving (403) the interface (113, 301) from the rest position into the coupling position, connecting (405) the cable to the interface (113, 301), moving (407) the interface (113, 301) from the coupling position into the rest position.

11. The connection method (400) according to claim 10, characterized in that the cable is guided through a cable entry (109, 303) and the cable entry is connected to the housing (100).

12. The connection method (400) according to claim 10, characterized in that when moving the interface (113, 301) from the coupling position to the rest position, the cable is rotated about its longitudinal axis together with at least a part of the interface (113, 301), so that the interface is moved into a secured position in which the interface (113, 301) is secured to prevent movement from the rest position into the coupling position.

13. An electronic system (200), wherein the electronic system (200) comprises:

an electronic component (201), a housing (100) according to claim 9, wherein the electronic component (201) is arranged in the housing (100) and is connected to a cable via the interface (113, 301) of the housing (100).

14. The housing according to claim 1, wherein the at least one elastic element is a mechanical spring (119,311).

15. A housing element (103) for a housing (100) for securing ignition sources, wherein the housing (100) is explosion-proof in respect of an explosion occurring inside the housing (100), and wherein the housing element (103) comprises:

a housing element body (101), an opening (107) introduced into the housing element body for connection to a cable entry (109, 303), an interface arranged on the housing element body (101) for connection to a cable (111) running through the opening (107), wherein the interface (113, 301) is movable between a coupling position and a rest position, wherein the interface (113, 301) is further away from one end of the housing element body (101) opposite the opening in the coupling position along a vertical axis of the housing element body (101) than in the rest position, wherein the interface (113,301) comprises at least one elastic element that presses the interface (113,301) from the rest position to the coupling position.

16. The housing element according to claim 15, wherein the at least one elastic element is a mechanical spring (119,311).

* * * * *